(12) United States Patent
Congreve et al.

(10) Patent No.: US 12,291,662 B2
(45) Date of Patent: May 6, 2025

(54) PHOTON UPCONVERSION NANOCAPSULES FOR 3D PRINTING AND OTHER APPLICATIONS

(71) Applicant: President and Fellows of Harvard College, Cambridge, MA (US)

(72) Inventors: Daniel N. Congreve, Cambridge, MA (US); Samuel N. Sanders, Cambridge, MA (US); Richard Christopher Stokes, Cambridge, MA (US); Mahesh Kumar Gangishetty, Arlington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 830 days.

(21) Appl. No.: 17/296,769

(22) PCT Filed: Nov. 27, 2019

(86) PCT No.: PCT/US2019/063629
§ 371 (c)(1),
(2) Date: May 25, 2021

(87) PCT Pub. No.: WO2020/113018
PCT Pub. Date: Jun. 4, 2020

(65) Prior Publication Data
US 2022/0025255 A1    Jan. 27, 2022

Related U.S. Application Data

(60) Provisional application No. 62/800,680, filed on May 25, 2021, provisional application No. 62/771,996, filed on May 25, 2021.

(51) Int. Cl.
*G03F 7/028* (2006.01)
*B29C 64/165* (2017.01)
(Continued)

(52) U.S. Cl.
CPC ............ *C09K 11/06* (2013.01); *B29C 64/165* (2017.08); *B29C 64/268* (2017.08); *B33Y 70/10* (2020.01);
(Continued)

(58) Field of Classification Search
None
See application file for complete search history.

(56) References Cited

U.S. PATENT DOCUMENTS 7,683,363 B2    3/2010  Miteva et al.
7,929,200 B2    4/2011  Miteva et al.
(Continued)

FOREIGN PATENT DOCUMENTS

CN    105764854 A    7/2016
CN    105939708 A    9/2016
(Continued)

OTHER PUBLICATIONS

Pun, et al., "TIPS-anthracene: a single fission or triplet fusion material", J. photon. Energy, vol. 8(2), articles 022006 (Jul. 2018) 10 pages.*
(Continued)

*Primary Examiner* — Martin J Angebranndt
(74) *Attorney, Agent, or Firm* — Wolf, Greenfield & Sacks, P.C.

(57) ABSTRACT

The present invention generally relates to photon upconversion nanocapsules for 3D printing and other applications. For example, one aspect is generally related to nanocapsules that contain an upconversion material. Light, such as laser light, focused on a region of liquid containing nanocapsules may be upconverted by the upconversion material to produce wavelengths sufficient to cause polymerization of a polymerizable entity to occur. However, in contrast, although other regions may receive some light, that light
(Continued)

may not be of sufficient focus or intensity to be upconverted, and thus, the polymerizable entity in those regions would generally not polymerize. In such a fashion, the extent of polymerization can be controlled, for example, by controlling where light is applied to the liquid. The light could be focused at arbitrary regions within the liquid, thus allowing true 3D-printing to occur. In addition, some embodiments of the invention generally relate to systems and methods for making or using such nanocapsules containing upconversion materials, products produced using such materials, kits including such materials, or the like.

21 Claims, 3 Drawing Sheets (51) Int. Cl.
 B29C 64/268 (2017.01)
 B33Y 10/00 (2015.01)
 B33Y 70/10 (2020.01)
 B33Y 80/00 (2015.01)
 C09K 11/02 (2006.01)
 C09K 11/06 (2006.01)
 G03F 7/029 (2006.01)
 B82Y 30/00 (2011.01)
 B82Y 40/00 (2011.01)

(52) U.S. Cl.
 CPC ............ *B33Y 80/00* (2014.12); *C09K 11/025* (2013.01); *G03F 7/028* (2013.01); *G03F 7/029* (2013.01); *B33Y 10/00* (2014.12); *B82Y 30/00* (2013.01); *B82Y 40/00* (2013.01); *C09K 2211/1011* (2013.01); *C09K 2211/185* (2013.01)

(56) References Cited

U.S. PATENT DOCUMENTS

| | | |
|---|---|---|
| 8,242,263 B2 | 8/2012 | Miteva et al. |
| 10,519,038 B2 | 12/2019 | Wang et al. |
| 2003/0139484 A1* | 7/2003 | Bentsen ................ G03F 7/0037 522/2 |
| 2007/0267134 A1 | 11/2007 | Konarski et al. |
| 2010/0301285 A1 | 12/2010 | Tzenka et al. |
| 2011/0013263 A1 | 1/2011 | Miteva et al. |
| 2011/0117202 A1* | 5/2011 | Bourke, Jr. ............... A61N 1/44 977/773 |
| 2013/0171060 A1 | 7/2013 | Ayres et al. |
| 2014/0148880 A1 | 5/2014 | Deisseroth et al. |
| 2015/0353758 A1 | 12/2015 | Weber |
| 2016/0202606 A1* | 7/2016 | Prasad .................. G03F 7/0385 250/459.1 |
| 2016/0262987 A1* | 9/2016 | Bublewitz ................ A61K 6/61 |
| 2016/0312113 A1 | 10/2016 | Murakami et al. |
| 2017/0000887 A1 | 1/2017 | Zhang et al. |
| 2017/0087920 A1 | 3/2017 | Guo et al. |
| 2017/0306221 A1 | 10/2017 | Koole et al. |
| 2018/0026202 A1 | 1/2018 | Danz et al. |
| 2018/0126630 A1 | 5/2018 | Panzer et al. |
| 2018/0311353 A1 | 11/2018 | Kohane et al. |
| 2021/0189156 A1 | 6/2021 | Baldeck et al. |
| 2022/0305724 A1 | 9/2022 | Congreve et al. |
| 2023/0094821 A1* | 3/2023 | Twietmeyer ........... B33Y 30/00 264/401 |
| 2023/0126590 A1* | 4/2023 | Goh ...................... B23C 5/1009 433/223 |
| 2023/0339187 A1* | 10/2023 | Kazlas ................... B33Y 10/00 |

FOREIGN PATENT DOCUMENTS

| | | | | |
|---|---|---|---|---|
| CN | 106799238 A | * | 6/2017 | ............ B01J 27/04 |
| CN | 108192590 A | * | 6/2018 | ............ A61K 47/02 |
| CN | 108534909 A | * | 9/2018 | ............ G01K 11/20 |
| KR | 101754777 A | * | 7/2017 | |
| WO | WO 2011/060033 A1 | | 5/2011 | |
| WO | WO 2015/102535 A1 | | 7/2015 | |
| WO | WO 2015/059180 A9 | | 5/2016 | |
| WO | WO-2017004310 A1 | * | 1/2017 | ............ A61K 31/09 |
| WO | WO 2017/049754 A1 | | 3/2017 | |
| WO | WO 2017/093530 A1 | | 6/2017 | |
| WO | WO 2018/055609 A1 | | 3/2018 | |
| WO | WO-2019025717 A1 | * | 2/2019 | ........... B29C 64/124 |
| WO | WO 2020/257231 A1 | | 12/2020 | |
| WO | WO 2021/067577 A1 | | 4/2021 | |

OTHER PUBLICATIONS

Zako et al., "Improvement in the dispersion stability and characterization of upconversion nanophosphors covalently modified with PEG as a fluorescence bioimaging probe", J. Mater. Sci., vol. 43 pp. 5325-5330 (2008) (Year: 2008).*
International Search Report and Written Opinion for Application No. PCT/US2019/063629 mailed Feb. 4, 2020.
Invitation to Pay Additional Fees for Application No. PCT/US20/38057 mailed Sep. 8, 2020.
International Search Report and Written Opinion for Application No. PCT/US20/38057 mailed Oct. 5, 2020.
Invitation to Pay Additional Fees for Application No. PCT/US2020/053765 mailed Dec. 3, 2020.
International Search Report and Written Opinion for Application No. PCT/US2020/053765 mailed Feb. 17, 2021.
Kang et al., Low-threshold photon upconversion capsules obtained by photoinduced interfacial polymerization. Angew Chem Int Ed Engl. Nov. 19, 2012;51(47):11841-4.
Kwon et al., Triplet-triplet annihilation upconversion in CdS-decorated SiO2 nanocapsules for sub-bandgap photocatalysis. ACS Appl Mater Interfaces. Jan. 14, 2015;7(1):318-25 and Supplemental Information. 11 pages.
Liu et al., A general strategy for biocompatible, high-effective upconversion nanocapsules based on triplet-triplet annihilation. J Am Chem Soc. Apr. 3, 2013;135(13):5029-37 and Supplemental Information. 20 pages.
Monguzzi et al., Low-Power-Photon Up-Conversion in Dual-Dye-Loaded Polymer Nanoparticles. Adv. Funct. Mater. 2012;22:139.
Simon et al., Low-power upconversion in dye-doped polymer nanoparticles. Macromol Rapid Commun. Apr. 13, 2012;33(6-7):498-502.
Svagan et al., Photon energy upconverting nanopaper: a bioinspired oxygen protection strategy. ACS Nano. Aug. 26, 2014;8(8):8198-207.
Thevenaz et al., Single-Component Upconverting Polymeric Nanoparticles. Macromol Rapid Commun. May 2016;37(10):826-32.
Thevenaz et al., Thermoresponsive low-power light upconverting polymer nanoparticles. Mater. Horiz. 2016; 3:602.
Vadrucci et al., Nanodroplet-Containing Polymers for Efficient Low-Power Light Upconversion. Adv Mater. Nov. 2017;29(41).
Wohnhaas et al., All Organic Nanofibers as Ultralight Versatile Support for Triplet-Triplet Annihilation Upconversion. ACS Macro Lett. 2013; 2(5)446-450 and Supplemental Information. 11 pages.
Wohnhaas et al., Annihilation upconversion in cells by embedding the dye system in polymeric nanocapsules. Macromol Biosci. Jun. 14, 2011;11(6):772-8.
PCT/US2019/063629, Feb. 4, 2020, International Search Report and Written Opinion.
PCT/US20/38057, Sep. 8, 2020, Invitation to Pay Additional Fees.
PCT/US20/38057, Oct. 5, 2020, International Search Report and Written Opinion.
PCT/US2020/053765, Dec. 3, 2020, Invitation to Pay Additional Fees.
PCT/US2020/053765, Feb. 17, 2021, International Search Report and Written Opinion.
Extended European Search Report for Application No. EP 19889990.8 mailed Jul. 8, 2022.

(56) References Cited

OTHER PUBLICATIONS

European Office Action for EP Application No. 19889990.8 mailed Apr. 24, 2023.
International Preliminary Report on Patentability for Application No. PCT/US2020/038057 mailed Dec. 30, 2021.
International Preliminary Report on Patentability for Application No. PCT/US2020/053765 mailed Apr. 14, 2022.
Ruiz-Morales et al., Three dimensional printing of components and functional devices for energy and environmental applications. Energy Environ. Sci., Feb. 28, 2017;10:846-859.
Turshatov et al., Micellar carrier for triplet-triplet annihilation-assisted photon energy upconversion in a water environment. New Journal of Physics. Aug. 31, 2011; 13(8): 83035.
Chinese Office Action for Application No. CN 201980077679.5 mailed Jun. 30, 2024.
International Preliminary Report on Patentability mailed Jun. 10, 2021 for Application No. PCT/US2019/063629.

\* cited by examiner

FIG. 3A mPEG silane

PHOTON UPCONVERSION NANOCAPSULES FOR 3D PRINTING AND OTHER APPLICATIONS

RELATED APPLICATIONS

This application is a U.S. National Stage Application claiming the benefit of International Application No. PCT/US2019/063629, filed Nov. 27, 2019, by Congreve, et al. entitled "Photon Upconversion Nanocapsules for 3D Printing and Other Applications," which claims the benefit of U.S. Provisional Patent Application Ser. No. 62/771,996, filed Nov. 27, 2018, by Congreve, et al., and U.S. Provisional Patent Application Ser. No. 62/800,680, filed Feb. 4, 2019, by Congreve, et al. Each of these is incorporated herein by reference in its entirety.

FIELD

The present invention generally relates to photon upconversion nanocapsules for 3D printing and other applications.

BACKGROUND

Additive manufacturing or "3D printing" promises to revolutionize industries such as prototyping and manufacturing, and several companies have recently received hundreds of millions of dollars in private and/or public funding due to the promise of this technology. Several companies now sell 3D printers, but none of these printers operate in a true 3D fashion. Instead, all use some form of extrusion, either layer by layer in most cases, or continuous withdrawal methods, to photopolymerize a polymer at a liquid-solid interface. The main limitation with these approaches is the inability to truly 3D "print" a pattern, because light absorption at locations besides the interface would lead to undesired, uncontrolled, or inadequate polymerization. Instead, a very slow interfacial process is used, limiting throughput, practicality and cost efficiency.

Typical implementations of 3D printing involve a vat of liquid and a solid stage, where the solid stage is lowered until a short layer of liquid polymer covers the stage. A laser "writes" a pattern onto this thin layer which hardens upon exposure. The stage then lowers further to immerse this material in more liquid, and exposure repeats until the structure has been formed. Countless companies use this technology for rapid prototyping. For example, a company can simply print a custom car part that may have gone out of production years ago. Similarly, some shoe companies have recently partnered with a leader in this field to 3D print unique structures for their line of sneakers. Due to the ability to create arbitrary designs, as well as form shapes that would be difficult to achieve by standard machining techniques, this technique has garnered incredible interest on the market. However, as mentioned, one of the main challenges in this field is that the stepwise printing nature limits printing speed and introduces steps into the surface, as a single layer of material is printed at a time. Thus, improvements in 3D printing technologies are needed.

SUMMARY

The present invention generally relates to photon upconversion nanocapsules for 3D printing and other applications. The subject matter of the present invention involves, in some cases, interrelated products, alternative solutions to a particular problem, and/or a plurality of different uses of one or more systems and/or articles.

In one aspect, systems are provided. In some embodiments, a system comprises: an upconversion material; a nanocapsule at least partially encapsulating the upconversion material; and a polymerizable entity and/or a monomer. In some embodiments, a system comprises a plurality of nanocapsules encapsulating the upconversion material. In some embodiments, a system comprises a plurality of polymerizable entities and/or monomers. In some embodiments, at least a portion of the nanocapsule is miscible with the monomer and/or the polymerizable entity. In some embodiments, the system is optically transparent. In some embodiments, the nanocapsule comprises an amphiphilic copolymer. In some embodiments, the nanocapsule comprises a surfactant. In some embodiments, the upconversion material comprises an annihilator, and the system further comprises a second upconversion material comprising a sensitizer. In some embodiments, the second upconversion material is at least partially encapsulated by the nanocapsule.

In some embodiments, a system comprises: an upconversion material; a nanocapsule having an interior portion, wherein the interior portion comprises the upconversion material and a solvent; and a monomer and/or a polymerizable entity. In some embodiments, the solvent comprises a nonpolar solvent. In some embodiments, the solvent comprises trimethylbenzene or trichlorobenzene or a combination thereof.

The system, in yet another set of embodiments, comprises a powder comprising a monomer and/or a polymerizable entity and nanocapsules having an interior portion. In some embodiments, the interior portion comprises an upconversion material.

In accordance with another set of embodiments, the system comprises a liquid comprising a polymerizable entity and nanocapsules having an interior portion. In certain cases, the interior portion comprises an upconversion material.

According to still another set of embodiments, the system comprises a polymer comprising nanocapsules having an interior portion. In certain embodiments, the interior portion comprises an upconversion material.

In one set of embodiments, the system comprises an upconversion material, a nanocapsule at least partially encapsulating the upconversion material, and a monomer or other polymerizable entity.

Still another set of embodiments is generally directed to a system comprising an upconversion material and a nanocapsule having an interior portion. In accordance with some embodiments, the interior portion may include the upconversion material and a solvent. The system may also comprise a monomer or other polymerizable entity in some instances.

In another aspect, methods are provided. In some embodiments, a method comprises: exposing a system to electromagnetic radiation, wherein the system comprises: an upconversion material; a nanocapsule at least partially encapsulating the upconversion material; and a monomer and/or a polymerizable entity. In some embodiments, exposing the system to electromagnetic radiation comprises shining a laser onto a region of the system.

The method, in another set of embodiments, comprises applying electromagnetic radiation to a liquid comprising a polymerizable entity and nanocapsules having an interior portion comprising an upconversion material, where the light is upconverted by the upconversion material, and polymerizing the monomer and/or a polymerizable entity within the liquid using the upconverted light.

According to still another set of embodiments, the method comprises exposing a system to electromagnetic radiation. In some cases, the system comprises an upconversion material, a nanocapsule at least partially encapsulating the upconversion material, and a monomer or other polymerizable entity.

In another aspect, the present invention is generally directed to a method of making a nanocapsule. For example, in certain embodiments, the method includes mixing an amphiphilic solution comprising an upconversion material with a surfactant to form nanocapsules comprising the surfactant and containing therein the upconversion material.

In yet another aspect, a system is described. In some embodiments, the system comprises, an upconversion material, an amphiphilic surfactant, and a nanocapsule having an interior portion, an exterior portion, and an interface between the interior portion and the exterior portion. In some embodiments, the interior portion contains the upconversion material, and the interface comprises a silicate and at least a portion of the amphiphilic surfactant. In some embodiments, the exterior portion comprises a hydrophilic component.

Other advantages and novel features of the present invention will become apparent from the following detailed description of various non-limiting embodiments of the invention when considered in conjunction with the accompanying figures.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

The present invention generally relates to photon upconversion nanocapsules for 3D printing and other applications. For example, one aspect is generally related to nanocapsules that contain an upconversion material. Light, such as laser light, focused on a region of liquid containing nanocapsules may be upconverted by the upconversion material to produce wavelengths sufficient to cause polymerization of a polymerizable entity to occur. However, in contrast, although other regions may receive some light, that light may not be of sufficient focus or intensity to be upconverted, and thus, the polymerizable entity in those regions would generally not polymerize. In such a fashion, the extent of polymerization can be controlled, for example, by controlling where light is applied to the liquid. The light could be focused at arbitrary regions within the liquid, thus allowing true 3D-printing to occur. In addition, some embodiments of the invention generally relate to systems and methods for making or using such nanocapsules containing upconversion materials, products produced using such materials, kits including such materials, or the like.

Certain embodiments of the invention use photon upconversion nanocapsules to drive photopolymerization. In an upconversion process, sequential absorption of two or more photons, e.g., by an absorptive material, can lead to the emission of light at shorter wavelengths than the excitation wavelengths by that material. For example, this may occur via a triplet annihilation upconversion process. Thus, the material is able to upconvert light from a first, lower-energy wavelength to a second, higher energy (shorter) wavelength. The upconverted light may then be able to initiate a polymerization reaction of a polymerizable entity (e.g., monomers) to occur. This can accordingly be used to direct where polymerization occurs within a print volume, allowing for true 3D-printing and other applications as discussed herein to occur.

Without wishing to be bound by any theory, and in contrast to other photopolymerization methods, photon upconversion photopolymerization may have a quadratic dependence on fluence, allowing a polymerizable entity (e.g., monomers) to polymerize at the focal point of light applied to a print volume. As discussed below, in some embodiments, a relatively inexpensive laser, e.g., produced by a laser diode, may be used to produce sufficient light to cause polymerization at the focal point (which may be relatively deep within the print volume), while not causing significant polymerization elsewhere. Therefore, true 3D addressing and printing can be achieved, e.g., without resorting to a stepwise, interfacial approach such as is described below. In some cases, true 3D printing can be achieved using hardware nearly identical to the current state of the art. It is worth noting that the robust photon upconversion materials used for this process and/or as discussed herein may have other applications, such as in photoredox catalysis chemistry or anti-counterfeiting. These are also discussed in more detail below.

Three-dimensional printing ("3D printing") is a process that can be used to rapidly produce nearly any imaginable structure, starting from a computer model, through the photopolymerization of a monomer (or other polymerizable entity) into a solid polymer. The polymerizable entity may be contained within a liquid or other suitable print volume, and light or other electromagnetic radiation may be applied to cause polymerization of the polymerizable entity to occur at desired locations, while avoiding or minimizing polymerization at other, undesired locations within the print volume.

Thus, certain aspects of the invention are directed to 3D printing applications, including true 3D printing, as well as other forms of 3D printing, including stepwise, extrusion, layer-by-layer, or continuous 3D printing techniques. In one set of embodiments, a liquid comprising a polymerizable entity is exposed to light or electromagnetic wavelength having a suitable wavelength to cause polymerization of the entity to occur. For example, a vat (or other container) of a liquid containing a polymerizable entity may be patterned by light, e.g., in three dimensions or on a layer, in order to cause polymerization of the entity to occur. In some cases, the liquid may then washed to recover the polymer.

Figure 1:
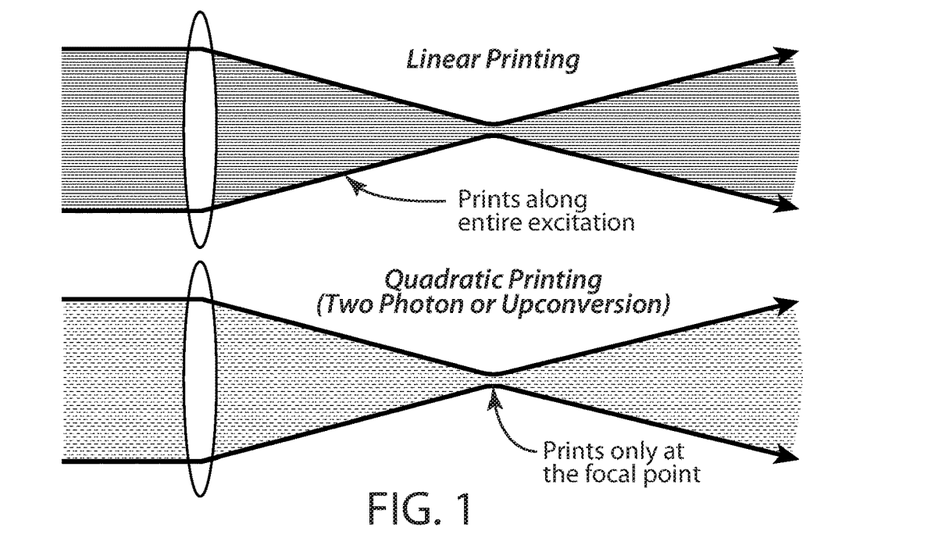
FIG. 1 shows some advantages to two photon excitation, or related photon wavelength conversion processes with quadratic light intensity such as photon upconversion, for selective printing within a volume of material, in accordance with certain embodiments.

In certain embodiments, two-photon photopolymerization can be used to overcome challenges associated with linear absorption (FIG. 1). For example, two-photon absorption can be used to excite material in the focal volume of the laser, which can then be translated for true 3D printing or other applications, e.g., as discussed herein. Without wishing to be bound by any theory, in this process, light absorption depends quadratically, not linearly, on excitation density. This means that the reaction runs where the light is most intense, limiting or reducing polymerization outside the focal point of the beam and allowing for only a small, deep spot to be polymerized, for example, within a print volume.

Two photon absorption, however, typically requires extremely high fluence and significant spatial and temporal pulse compression. Therefore, extremely expensive femtosecond lasers and small spot sizes have been used in the past. These limitations have kept two-photon photopolymerization as a niche technique for high-resolution printing of small-scale 3D features. Still, these printers are regularly employed in research due to their unprecedented submicron spatial resolution and simplicity of the writing process, and this technique has set a number of records for producing the smallest 3D printed features. However, these limitations have also prevented these techniques from becoming more widely used.

Figure 2A:
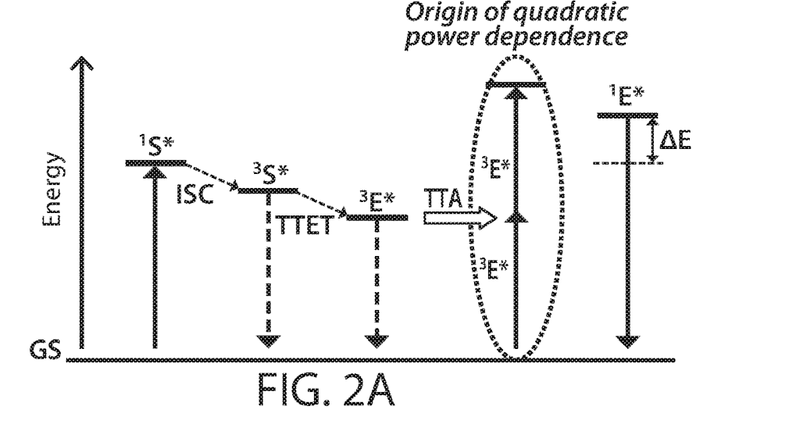
FIGS. 2A-2B show encapsulation of upconversion materials, which allows high local concentrations, but low overall concentrations of the upconverting material, in another embodiment of the invention.

In contrast, in some embodiments of the invention, photon upconversion is used to drive photopolymerization. In this process, two lower-energy photons generate one higher-energy photon via molecular states as part of the upconversion process (FIG. 2A). This upconversion process is quadratic, but uses orders of magnitude less light than two-photon absorption, which may be useful to allow the production of 3D-printed polymers without expensive lasers, allowing for huge cost reductions and/or greater print speed and volume in various embodiments.

Accordingly, certain embodiments of the invention are generally directed to nanocapsules containing upconversion materials that can be used to facilitate photon upconversion. The nanocapsules may be contained within a liquid or other print volume, which may also contain polymerizable entities (such as monomers), cross-linking agents, photopolymerization initiators, or the like, e.g., as discussed herein. Light focused on the nanocapsules may be upconverted to produce wavelengths sufficient to cause polymerization to occur. However, in contrast, although other regions within the print volume may receive some light, that light may not be sufficient to be upconverted, and thus, any polymerizable entities in those regions would generally not polymerize. Accordingly, the regions within the print volume where polymerization occurs can be readily controlled.

Thus, as a non-limiting example, one set of embodiments is directed to a nanocapsule comprising a liquid core or interior portion comprising a substantially amphiphilic solvent, such as oleic acid, that dissolves upconversion materials that are soluble therein, a silica shell which prevents or inhibits disintegration of the nanocapsules, and a polyethylene glycol outer portion that allows dispersion or dissolution of the nanocapsules in a number of different solvents or liquids. Other embodiments of nanocapsules, e.g., involving various materials for the interior portion, the nanocapsule, and the outer portion are also discussed in more detail below.

Figure 2B:
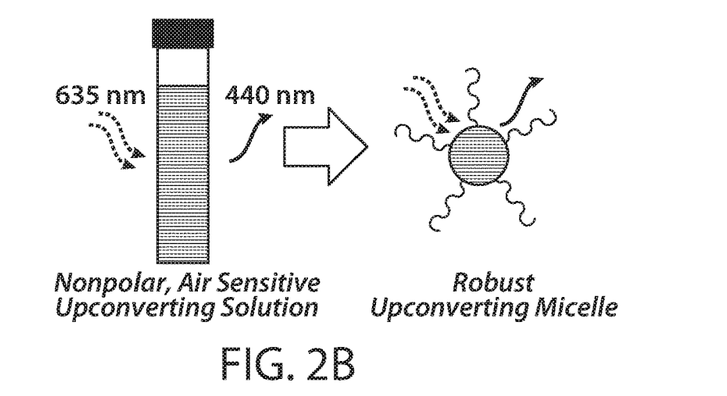

Historically, the major challenge associated with photon upconversion has been the high concentration of molecules needed to perform the process, leading to upconversion only at the surface of the print volume. However, in some embodiments as discussed herein, the upconversion material is encapsulated in nanocapsules. In this way, a high local concentration of material can be obtained within the nanocapsules, while the overall concentration can be tuned simply by controlling the nanocapsule density. By using nanocapsules, e.g., with smaller sizes than the wavelength of light, optical transparency needed for true 3D printing may be achieved. Some embodiments, accordingly, are directed to a system containing nanocapsules and monomers (or other polymerizable entities) that can be excited, for example, at 635 nm to selectively produce 445 nm light (higher energy) to induce photopolymerization only where light intensity is high (FIG. 2B). Because this system has the same quadratic dependence as two-photon absorption, similar optics can be utilized in certain cases to generate a deep, selective polymerization within the print volume. However, due to the much lower light intensity required, inexpensive laser diodes can be used in some embodiments, greatly reducing cost and/or complexity. In addition, further examples of such systems are discussed in more detail below.

Certain aspects of the present invention are thus generally directed to nanocapsules containing an upconversion material, e.g., contained within an interior portion of the nanocapsules. Various embodiments are directed to different sizes and compositions of nanocapsules, interior portions, and upconversion materials, for example, which may be contained within a suitable liquid.

One set of embodiments is directed to nanocapsules, e.g., defining an interior portion. The nanocapsules may take a variety of shapes, including micelles or liposomes. A micelle is typically formed from one or more surfactants, e.g., having a relatively hydrophilic portion and a relatively hydrophobic portion. The micelle may have a substantially spherical shape, e.g., where the hydrophilic portion defines an exterior portion of the micelle, while the hydrophobic portion defines an interior portion of the micelle. In some cases, other components may be present within the interior portion of the micelle, e.g., hydrophobic liquids or solvents, such as those discussed herein. Liposomes are similar, except that instead of a single layer, the surfactants form a bilayer, and the interior portion is typically hydrophilic rather than hydrophobic. However, the interior of the bilayer is typically hydrophobic.

The nanocapsules are typically approximately spherical, and may have an average diameter of less than 1 micrometer, e.g., such that the nanocapsules have an average diameter on the order of nanometers. The nanocapsules, for example, may have an average diameter of less than about 1 micrometer, less than about 900 nm, less than about 800 nm, less than about 700 nm, less than about 600 nm, less than about 500 nm, less than about 400 nm, less than about 300 nm, less than about 200 nm, less than about 100 nm, less than about 90 nm, less than about 80 nm, less than about 70 nm, less than about 60 nm, less than about 50 nm, less than 40 nm, less than about 30 nm, less than about 20 nm, less than about 10 nm, less than about 5 nm, less than about 3 nm, etc. In addition, some cases, the nanocapsules may have an average diameter of at least about 5 nm, at least about 10 nm, at least about 20 nm, at least about 30 nm, at least about 40 nm, at least about 50 nm, at least about 60 nm, at least about 70 nm, at least about 80 nm, at least about 90 nm, at least about 100 nm, at least about 200 nm, at least about 300 nm, at least about 400 nm, at least about 500 nm, at least about 600 nm, at least about 700 nm, at least about 800 nm, at least about 900 nm, etc. In some cases, combinations of any of these are also possible. For example, the nanocapsules may have a diameter between or equal to 30 and 40 nm between 50 nm and 100 nm, between 100 nm and 400 nm, or the like. In addition, it should be understood that in some embodiments, the nanocapsules may be present with a range of sizes or average diameters (i.e., the nanocapsules need not all have precisely the same dimensions), which may include any suitable combination of any of the above-described dimensions.

In some cases, the nanocapsules are smaller than the wavelength of visible light. Nanocapsules having such smaller dimensions may be useful in certain embodiments, as they do not substantially interfere with the passage of visible light, thus, for example, allowing liquids containing such nanocapsules to appear optically transparent, or to allow visible light to pass without significant scatter.

The nanocapsules can be formed from a variety of surfactants and/or other materials, including silica or amphiphilic materials. For example, in one set of embodiments, the nanocapsules can be formed from amphiphilic copolymers. Such copolymers may comprise one or more relatively hydrophobic portions and one or more relatively hydrophilic portions, e.g., forming the copolymer. For example, the copolymer may be a block copolymer comprising one or more relatively hydrophobic blocks and one or more relatively hydrophilic blocks. Examples of suitable copolymeric blocks include, but are not limited to, polyethylene glycol, polypropylene glycol, or the like.

One non-limiting example of amphiphilic materials are the poloxamers, e.g., comprising a central hydrophobic block of polypropylene glycol flanked by hydrophilic blocks of polyethylene glycol. The poloxamer may have a structure:

where a, b, and c are each independently positive, and * indicates a point of attachment. a and c may the same or different. a may be, for example, between 2 and 130 (for example, between 100 and 102), and b may be, for example, between 15 and 67 (for example, between 55 and 57). Non-limiting examples include Pluronic®F127, poloxamer 407, Pluronic® P105, or the like. Other non-limiting examples of surfactants include Triton™ X-100 surfactants, IGEPAL® CA-630, sodium dodecyl sulfate, amphiphilic copolymers, amphiphilic diblock copolymers, amphiphilic block copolymers, amphiphilic triblock copolymers, polyethylene glycol (PEG)-polypropylene glycol (PPG) block copolymers, etc. Triton™ X-100 has a structure:

where n is positive, e.g., between 9 and 10. Many of these surfactants are available commercially.

In addition, in one set of embodiments, the nanocapsules can be formed to be substantially rigid. In some cases, rigidity can be determining using techniques such as nanoindentation AFM. For example, the nanocapsules may exhibit AFM values for elastic modulus (the ratio of the force exerted upon a substance or body to the resultant deformation) of at least $10^4$ Pa, at least $3 \times 10^4$ Pa, at least $5 \times 10^4$ Pa, at least $10^5$ Pa, at least $3 \times 10^5$ Pa, at least $5 \times 10^5$ Pa, at least $10^6$ Pa, at least $3 \times 10^6$ Pa, at least $5 \times 10^6$ Pa, at least $10^7$ Pa, at least $3 \times 10^7$ Pa, at least $5 \times 10^7$ Pa, at least $10^8$ Pa, at least $3 \times 10^8$ Pa, at least $5 \times 10^8$ Pa, at least $10^9$ Pa, at least $3 \times 10^9$ Pa, at least $5 \times 10^9$ Pa, at least $10^{10}$ Pa, etc. In addition in some cases, the elastic modulus may be less than $10^{10}$ Pa, less than $10^9$ Pa, less than $10^8$ Pa, less than $10^7$ Pa, less than $10^6$ Pa, or less than $10^5$ Pa.

This may be useful, for example, to prevent or reduce disintegration or degradation of the nanocapsules, e.g., when contained within a solvent such as discussed herein. In addition, in some cases, the nanocapsules may comprise a relatively hydrophilic outer portion that can be used to facilitate dispersion in a solvent. For instance, the nanocapsule may have an outer shell comprising polyethylene glycol units, polyacrylates, polyvinyl esters, polyvinyl amides, etc. In addition, in some cases, a nanocapsule may be prepared, e.g., comprising polyethylene glycol units, and functionalized to add different functionalities, for example, by addition of a polystyrene chain to increase their compatibility with highly nonpolar resins.

In some cases, the relatively hydrophilic outer portion is covalently linked to the rest of the shell. For example, the polyethylene glycol units may be covalently linked to surfactants or other species. Also, the surfactants within the nanocapsules can be crosslinked together in certain embodiments. This may be useful, for example, for increasing the durability, rigidity, etc. of the nanocapsules. Non-limiting examples of suitable crosslinking agents include any of those discussed herein.

In some embodiments, a hydrophilic component of an outer portion (e.g., an exterior portion) comprises polyethylene glycol (PEG). In some embodiments, the polyethylene glycol has a molecular weight of at least 300 g/mol, of at least 600 g/mol, of at least 900 g/mol, of at least 1,200 g/mol, of at least 2,400 g/mol, of at least 5,000 g/mol, of at least 7,500 g/mol, of at least 10,000 g/mol, of at least 20,000 g/mol, of at least 30,000 g/mol, of at least 40,000 g/mol, or of at least 50,000 g/mol. In some embodiments, the polyethylene glycol has a molecular weight no greater than 50,000 g/mol, no greater than 40,000 g/mol, no greater than 30,000 g/mol, no greater than 20,000 g/mol, no greater than 10,000 g/mol, no greater than 7,500 g/mol, no greater than 5,000 g/mol, no greater than 2,400 g/mol, no greater than 1,200 g/mol, no greater than 900 g/mol, no greater than 600 g/mol, or no greater than 300 g/mol. Combinations of the above-referenced ranges are also possible (e.g., at least 300 g/mol and no greater than 7,500 g/mol). Other ranges are also possible.

For instance, in some embodiments, the nanocapsules may comprise a silica ($SiO_2$) shell. This may, for instance, impart some rigidity to the nanocapsules. Such a shell may be formed, for example, upon reaction of a silane (e.g., 3-aminopropyl triethoxysilane) with a silicate (e.g., tetraethyl orthosilicate), as discussed in more detail below. The silica shell may also be crosslinked together in certain embodiments. In addition, in some cases, the silicate may comprise a hydrophilic portion (e.g., methoxy polyethylene glycol tetraethyl orthosilicate), such that upon formation of the silica shell, the nanocapsule comprises an outer portion that is relatively hydrophilic (e.g., comprising polyethylene glycol), such as was noted above. Such a relatively hydrophilic outer portion may, for example, allow dispersion or dissolution of the nanocapsules in a number of different solvents or liquids. In addition, the relatively hydrophilic portions (e.g., comprising polyethylene glycol units) thus can be covalently linked to the silica shell.

The nanocapsules may also comprise an interior portion comprising one or more upconversion materials. A variety of upconversion materials can be used, including those known to those of ordinary skill in the art. A nanocapsule may comprise one or more upconversion materials (e.g., two or more upconversion materials). In some embodiments, the upconversion material comprises an annihilator (also referred to as an acceptor or emitter). The annihilator may emit photons. In some embodiments, the upconversion material may also comprise a sensitizer, which absorbs low energy light and upconverts it by transferring energy to the annihilator, where two triplet excitons may combine to produce a higher energy singlet exciton that may emit high-frequency or shorter-wavelength light, e.g., via annihilation upconversion. In some cases, more than one annihilator and/or more than one sensitizer may be present.

Some examples of annihilators, e.g., where fusion or emission occurs, include, but are not limited to, 9,10-diphenylanthracene (DPA), 9,10-Bis[(triisopropylsilyl)ethynyl]anthracene (TIPS-anthracene), TIPS-tetracene, tetra-tert-butylperylene, anthracene (An), 2,5-diphenyloxazole (PPO), rubrene, 2-chloro-bis-phenylethynylanthracene (2CBPEA), 9,10-bis(phenylethnyl)anthracene (BPEA), 9,10-bis(phenylethynyl)napthacene (BPEN), perylene, coumarin 343 (C343), 9,10-dimethylanthracene (DMA), pyrene, tert-butylpyrene, and iodophenyl-bearing boron dipyrromethene (BODIPY) derivatives BD-1 and BD-2. Halogenated derivatives of the above-referenced compounds are also possible. For example, DPA may be further functionalized with a halogen (e.g., fluorine, chlorine, bromine, iodine) and may also perform as an annihilator. In such a case, the annihilators referenced above may be derivizated such that an element (e.g., a hydrogen atom) may be replaced with at least one halogen. In some embodiments more than one element (e.g., two hydrogens, three hydrogens, etc.) may be replaced with more than one halogen (e.g., two halogens, three halogens, etc.). In some instances, some or all of the hydrogens may be replaced by halogens.

As mentioned, in some embodiments, the upconversion material comprises a sensitizer. Some examples of sensitizers, e.g., which absorb low energy light and upconvert it by transferring energy to the annihilator, include but are not limited to palladium octabutoxy phthalocyanine (PdOBuPc), platinum tetraphenyltetranaphthoporphyrin (PtTPTNP), palladium(II)-meso-tetraphenyl-tetrabenzoporphyrin (PdTPTBP), [Ru(dmb)$_3$]$^{2+}$ (dmb is 4,4'-dimethyl-2,2'-bipyridine), 2,3-butanedione (biacetyl), palladium(II) tertraanthraporphyrin (PdTAP), platinum(II) tetraphenyltetrabenzoporphyrin (PtTPBP), palladium meso-tetraphenylltetrabenzoporphyrin (PdPh$_4$TBP), palladium octaethylporphyrin (PdOEP), 11,15,18,22,25 octabutoxyphthalocyanine (PdPc(OBu)$_8$), platinum octaethylporphyrin (PtOEP), zinc(II) meso-tetraphenylporphine (ZnTPP), [Ru(dmb)$_3$]$^{2+}$, palladium(II)tetraphenyltetrabenzoporphyrin (PdTPBP), palladium(II) meso-tetraphenyl-octamethoxide-tetranaphtholporphyrin (PdPh$_4$OMe$_8$TNP), 2-methoxythioxanthone (2MeOTX), and Ir(ppy)$_3$ (ppy=2-phenylpyridine). Additional non-limiting examples of sensitizers include ZnS, CdSe, PbSe, and PbS quantum dots. In some embodiments, the sensitizer is PdTPTBP, PdOEP, PtOEP, or PdPh$_4$TBP.

Other examples of upconversion materials include those disclosed in Int. Pat. Apl. Nos. PCT/US18/61251 and PCT/US18/61261, each incorporated herein by reference in its entirety. Still other examples include an optionally substituted polyacene species or an optionally substituted polyene species. The optionally substituted polyacene species may be an optionally substituted tetracene or an optionally substituted pentacene. In some cases, the optionally substituted polyacene species is tetracene, rubrene, dithienyl tetracene, TIPS-tetracene, dibithienyl tetracene, diphenyl tetracene, terbutyl rubrene, pentacene, TIPS-pentacene, diphenyl pentacene, dibiphenyl pentacene, dithienyl pentacene, or dibithienyl pentacene. In some cases, the optionally substituted polyene species is diphenylbutadiene, diphenylhexatriene, or diphenyloctatetraene. In some cases, the optionally substituted polyacene comprises a heteroatom.

These (a sensitizer and an annihilator) may be used together in the nanocapsule. In some embodiments, a nanocapsule comprises a sensitizer and an annihilator. These may be free-floating in solution in certain embodiments, e.g., contained within the nanocapsule, e.g., in an interior portion.

In some embodiments, one or more of the upconversion materials, including annihilators and/or sensitizers such as those described herein, may be dissolved or otherwise contained in an interior portion of a nanocapsule. The interior portion may be substantially polar or substantially nonpolar. For example, the interior portion may contain a solvent that is substantially polar or miscible in water, or one that is substantially nonpolar or is substantially immiscible in water, e.g., such that it forms a separate phase when mixed with water (even if some portions of the solvent can dissolve in water). Non-limiting examples of substantially polar solvents include water, or other aqueous fluids, such as ethanol. In some embodiments, an amphiphilic solvent may be used. Non-limiting examples of substantially amphiphilic or non-polar solvents include carboxylic acids such as oleic acid, stearic acid, arachidonic acid, linolenic acid, or other similar carboxylic acids with shorter or longer aliphatic chains. In some embodiments, a non-polar solvent may be used. Additional examples of nonpolar or amphiphilic solvents include, but are not limited to, trimethlybenzene, trichlorobenzene, chloroform, toluene, or the like.

The nanocapsules can be determined as containing an upconversion material, for example, by dissolving the nanocapsules in a suitable solvent (if not already present within a liquid). An absorption spectrum can be obtained to determine the longest wavelength absorption peak, or the peak which is used for exciting the polymer for 3D printing. The peak is excited and its emission spectrum is determined as a function of power. For an upconversion material, anti-stokes emissions will be observed, e.g., particularly at higher excitation densities. This observation of anti-stokes emission may thus be used to identify an upconversion material.

In some aspects, the nanocapsules may be contained within a liquid or other material, although in some embodiments as discussed herein, the nanocapsules may be present in other forms. For instance, the nanocapsules may be present as a powder or a stock solution, e.g., to be dissolved or dispersed within a liquid, as discussed herein.

The nanocapsules may be present within the liquid (or other material) in any suitable concentration. For example, the nanocapsules may be present at a concentration of at least about 1 mg/mL, at least about 3 mg/mL, at least about 5 mg/mL, at least about 10 mg/mL, at least about 30 mg/mL, at least about 50 mg/mL, at least about 100 mg/mL, at least about 300 mg/mL, at least about 500 mg/mL, at least about 1 g/mL, etc.

In certain embodiments, the liquid is substantially polar. For example, the liquid may be aqueous, or substantially miscible in water. Non-limiting examples include water or ethanol. In some cases, for example, the liquid may be at least 50 wt %, at least 60 wt %, at least 70 wt %, at least 80 wt %, at least 90 wt %, or at least 95 wt % water.

The liquid can also be substantially nonpolar in certain cases, e.g., within a substantially nonpolar solvent such as discussed herein. Other examples of suitable nonpolar liquids include, but are not limited to, toluene, dichloromethane, chloroform, or the like.

Furthermore, in certain cases, the nanocapsules may contain outer portions that facilitate the dispersion or dissolution of the nanocapsules in the liquid or other material. For instance, if the liquid is substantially polar, the outer portion may comprise hydrophilic portions such as polyethylene glycol units.

In some cases, the liquid may also contain a polymerizable entity (e.g., monomers as discussed herein), and optionally other components that can be used for polymerization, such as cross-linking agents, photopolymerization initiators, and the like. Examples of these are discussed in more detail below.

For example, in some embodiments, such a liquid or other material may be used to facilitate polymerization of the polymerizable entity. For instance, light or other electromagnetic radiation may be focused on specific regions within the liquid that can be upconverted by the nanocapsules to cause polymerization in those regions to occur, while avoiding or minimizing polymerization in other regions of the liquid. Thus, in some cases, the liquid may be one that is optically transparent. Optical transparency may be determined, for example, by taking an absorption spectrum. The transmission of light, or the optical transparency, can be determined as absorbance=2−log(transmittance).

In some cases, the optical transparency may be determined using nanocapsules made without including upconversion materials, in which they should not absorb or scatter any light between 360-800 nm. For example, the nanocapsules, at 5 weight percent in a 1 centimeter path length cuvette, may transmit light in those wavelengths at least 90%, at least 95%, at least, 97%, at least 98%, or at least 99% transmittance.

The liquid may have any suitable viscosity. In some cases, the viscosity is relatively low (e.g., similar to water), although in other cases, the viscosity may be higher. For example, relatively high viscosities may be useful to allow relatively fast polymerization of the polymerizable entity to form a polymeric object to occur within the liquid or other material, e.g., without the polymeric object being able to drift too far or too quickly away from its initial position, due to the viscosity of the liquid. Thus, in certain embodiments, the polymerizable entity may be polymerized into a solid object while free-floating in a liquid. In contrast, in many prior art systems, a forming object must be held in place within a liquid to keep it from drifting away.

Thus, for example, the viscosity of the liquid may be at least about 1 cP, at least about 3 cP, at least about 5 cP, at least about 10 cP, at least about 30 cP, at least about 50 cP, at least about 100 cP, at least about 300 cP, at least about 500 cP, at least about 1,000 cP, at least about 3,000 cP, at least about 5,000 cP, at least about 10,000 cP, at least about 30,000 cP, at least about 50,000 cP, at least about 100,000 cP, etc. In some cases, the viscosity may be less than about 300,000 cP, less than about 100,000 cP, less than about 50,000 cP, less than about 30,000 cP, less than about 10,000 cP, less than about 5,000 cP, less than about 3,000 cP, less than about 1,000 cP, less than about 500 cP, less than about 300 cP, less than about 100 cP, less than about 50 cP, less than about 30 cP, less than about 10 cP, less than about 5 cP, less than about 3 cP, etc. Combinations of any of these ranges are also possible. For example, the viscosity of the liquid may be between 10,000 cP and 300,000 cP.

A variety of techniques or components may be used within the liquid to increase its viscosity. Examples of components that can be added include, but are not limited to, gelatin, xanthan gum or other macromolecules. In some cases, a polymer of the resin itself may be used to increase the viscosity of the liquid. For example, for a methacrylate monomer, a component such as polymethacrylate may be added to the liquid to increase its viscosity. In addition, in some cases, a combination of techniques and/or components may be used.

In some embodiments, the nanocapsules form micelles or other nanocapsules in water, or other liquids such as discussed herein. They can be made, for example, by stirring a suitable polymer or surfactant in water or other liquids to form micelles or other nanocapsules. In some cases, adding a suitable surfactant to a suitable liquid causes the nanocapsules to from spontaneously or through self-assembly.

For example, the micelles or other nanocapsules can be stirred in a nonpolar solution containing the upconversion material to form the upconversion material encapsulated in nanocapsules. In some cases, the micelles or other nanocapsules may swell, e.g., upon exposure to a second solvent. The second solvent may be nonpolar or immiscible in water. Non-limiting examples include trimethylbenzene, trichlorobenzene, chloroform, or the like. The micelles or other nanocapsules may be present within water or aqueous solution, a monomer, a polymerizable entity, a resin, or the like.

As mentioned, the liquid or other material may also contain one or more polymerizable entities. The entities may be, for example, monomers or other entities that can be polymerized together to form a polymer, such as oligomers or other partially-formed polymers. For instance, in some cases, light may be used to cause the polymerizable entities to polymerize, e.g., the polymerizable entities may be photopolymerizable. In some cases, the entities may be polymerized to form a polymeric solid object.

In one set of embodiments, the polymerizable entity may include a resin, such as a 3D-printing resin. Examples of 3D-printing resins include, but are not limited to, thermoplastics and thermo-solid resins. Many of these are commercially example. Specific examples include polyamides, polypropylene, ABS, PLA, PVA, PET, PETT, HIPS, nylon, etc. Examples of monomers include vinyl monomers, acrylates, styrenic monomers, and the like. In some cases, the monomer has a double bond, e.g., an alkene. A variety of monomer can be used, e.g., for 3D printing. Examples of acrylates include, but are not limited to, methacrylate, methyl methacrylate, polyacrylates, or the like.

Still other examples of monomers include, but are not limited to, branched polyethylene glycol; linear polyethylene glycol; polyamides and polyamines such as nylon 6, nylon 6,6, poly(pyromellitic dianhydride-co-4,4'-oxydianiline); polyesters such as poly(ethylene terephthalate, poly (4,4'-methylenebis(phenyl isocyanate)-alt-1,4-butanediol/di (propylene glycol)/polycaprolactone); polyethers such as Pluronic®F127, poly(2,6-dimethyl-1,4-phenylene oxide); poly(oxy-1,4-phenylenesulfonyl-1,4-phenylene); silicones such as poly(dimethylsiloxane); vinyl polymers such as HDPE, poly(acrylonitrile-co-butadiene) acrylonitrile, poly (1-(4-(3-carboxy-4-hydroxyphenylazo)benzenesulfonamido)-1,2-ethanediyl, sodium salt), polychloroprene, polyethylene, PMMA, polystyrene, poly(styrene-co-acrylonitrile), polystyrene-block-poly(ethylene-ran-butylene)-block-polystyrene, poly(vinyl acetate); poly(vinyl alcohol), polyvinylpyrrolidone; etc.

The liquid may also optionally contain one or more photopolymerization initiators according to certain embodiments. The initiators may form free radicals or cations upon initiation. Examples of photopolymerization initiators, but are not limited to, isopropylthioxanthone, benzophenone, 2,2-azobisisobutyronitrile, camphorquinone, diphenyltrimethylbenzoylphosphine oxide (TPO), HCP (1-hydroxycyclohexylphenylketone), BAPO (phenyl bis-2,4,6-(trimethylbenzoyl)phosphine oxide), Irgacure784™. Other examples include Norrish Type-1 and Norrish Type-2 initiators.

In addition, in some cases, the liquid may also contain one or more cross-linking agents that are able to polymerize with the polymerizable entity. Non-limiting examples of cross-linking agents include ethylene glycol dimethacrylate, trimethylolpropane triacrylate, divinylbenzene, N,N'-methylenebisacrylamide, etc.

In certain aspects, the liquid or other suitable material may be contained within a suitable container, and light (or other suitable electromagnetic radiation) applied to cause polymerization of the polymerizable entities to occur, e.g., to form a solid polymeric object within the liquid. For example, as discussed, the light may be focused or directed onto certain specific regions within a print volume containing a liquid or other material that can be upconverted by the nanocapsules to cause polymerization of the polymerizable entities to occur. The light may be visible light, ultraviolet light, or other suitable forms of electromagnetic radiation.

In some cases, the light may be directed at the upconversion materials, e.g., such that the resulting upconverted light is able to initiate polymerization. For example, the mixture or liquid within a print volume containing the upconversion materials may be irradiated with light, e.g., laser light. Suitable wavelengths include 400 to 800 nm, e.g., as the excitation wavelength. The upconverted light can be produced locally between 390-500 nm using 532 nm input light, in the range of photopolymerization initiators. As another example, light can be applied having a range of between 600 nm and 700 nm, or between 600 nm and 650 nm. The light may be applied using any suitable light or electromagnetic radiation source, such as a laser or other coherent light source. For example, in one embodiment, the light source is a laser diode, such as those available commercially. In some embodiments, the radiation source (e.g., the light source) is a light-emitting diode (LED).

The liquid or other material containing the nanocapsules may be contained within any suitable container, which may define a print volume in some cases. Light may penetrate to at least various depths within the liquid, e.g., if the liquid is optically transparent. For instance, light can penetrate across, e.g., a 4-inch print space, or more (e.g., 5 inches, 6 inches, 7 inches, 8 inches, etc.). These may be used with a variety of commonly used 3D printing resins.

In some embodiments, the light or other electromagnetic radiation may be focused onto one or more specific regions within the print volume. As noted above, the upconversion material may have a quadratic dependence on fluence, allowing the polymerizable entity to polymerize at a focal point or region of the light within the print volume, e.g., without causing polymerization in other regions within the print volume, due to the quadratic dependence. In some cases, due to this quadratic dependence, relatively low light intensities can be used polymerization at a focal point or region. For instance, the intensity or power density of the applied electromagnetic radiation applied to the focal point or region to cause polymerization to occur may be less than 5,000 $W/cm^2$, less than 3,000 $W/cm^2$, less than 2,000 $W/cm^2$, less than 1,000 $W/cm^2$, less than 500 $W/cm^2$, less than 300 $W/cm^2$, less than 200 $W/cm^2$, less than 100 $W/cm^2$, less than 50 $W/cm^2$, less than 30 $W/cm^2$, less than 20 $W/cm^2$, less than 10 $W/cm^2$, less than 5 $W/cm^2$, less than 3 $W/cm^2$, less than 2 $W/cm^2$, less than 1 $W/cm^2$, less than 500 $mW/cm^2$, less than 300 $mW/cm^2$, less than 200 $mW/cm^2$, less than 100 $mW/cm^2$, etc.

Accordingly, another aspect is directed to a polymer formed using such processes. The polymer may be a solid polymer object in some embodiments, and have any suitable shape or size. In some cases, after formation, the polymer may contain nanocapsules, such as those discussed herein. The nanocapsules may be distributed or embedded within the polymer, evenly or unevenly, and may in some cases still contain one or more upconversion materials.

The polymer may, in some cases, be prepared using additive manufacturing or "3D printing" techniques, such as those discussed herein. Other applications that may involve such polymers include photoredox catalysis chemistry or anti-counterfeiting, etc., e.g., as discussed herein. The polymers may include, for example, thermoplastics or thermosolid polymers, such as polyamides, polypropylene, ABS, PLA, PVA, PET, PETT, HIPS, nylon, or the like. Other examples include polymers formed from vinyl, acrylate, styrene, or the like, such as polyacrylates, polymethacrylates, etc. Still other non-limiting examples include any of the polymers discussed herein.

The polymer can be determined as containing an upconversion material, for example, by determining if the absorption spectrum of the polymer is transmissive. If not, the polymer may be contained or dissolved within a suitable solvent and the absorption spectrum of the polymer therein determined. For example, the absorption peaks may be found and excited to determine if upconverted fluorescence is present. In some cases, the polymer may be excited at different wavelengths, e.g., starting at 400 nm and moving upwards 10 nm at a time until 1100 nm or a reasonable stopping point is reached. Anti-stokes emission may then be used to determine if an upconversion material is present. In some cases, a cross-sectional scanning electron microscopy or scanning tunneling microscopy may be used to determine well-defined nanocapsules or nanoparticles present within the polymer.

Yet another aspect of the present invention is generally directed to methods for producing such systems as discussed herein, including liquids, polymerizable entities, nanocapsules, upconversion materials, and the like. For instance, one set of embodiments is generally directed to systems and methods for producing nanocapsules comprising an interior portion comprising an upconversion material. In some cases, a solution containing a suitable polar or nonpolar solvent and one or more upconversion materials (e.g., annihilators and/or sensitizers) may be used to form the interior portion of the nanocapsule. This may be combined with a suitable liquid and a suitable surfactant in any suitable order.

Examples of suitable surfactants include, but are not limited to, silanes such as 3-aminopropyl triethoxysilane, or other aminosilanes. Without wishing to be bound by any theory, it is believed that the amine group of the aminosilane can form a salt complex with a carboxylic acid (e.g., oleic acid), where the amine takes a proton and becomes positively charged, and the COOH of the carboxylic acid loses the proton and becomes negatively charged. Silanes containing other functional groups able to accept a proton from a carboxylic acid could accordingly be used as well. Additional non-limiting examples of each of these components have been discussed herein.

The liquid and the solvent may be substantially immiscible, and may separate into separate phases, such as micelles or other nanocapsules, stabilized by the presence of the surfactant. For instance, the interior portion may be relatively nonpolar or hydrophobic, while the liquid may be relatively polar or hydrophilic (for example, comprising water or another aqueous solution). In some cases, such nanocapsules may form spontaneously or through self-assembly. In addition, in certain embodiments, the average nanocapsule size may be controlled to produce the sizes as discussed herein, e.g., by controlling the concentration of the components, by stirring the mixture, etc.

In some cases, a silica shell may be formed on the nanocapsule. For example, a silane within the nanocapsule may be exposed to a silicate, such as tetraethyl orthosilicate, and these may react to form $SiO_2$ in some cases. In addition, in some cases, at least some of the silicates may be modified such that upon reaction, the nanocapsule further contains a second layer/an outer layer. For instance, the silicate may comprise a hydrophilic portion that produces a substantially hydrophilic outer layer on the nanocapsule. For instance, the silicates may include a hydrophilic portion such as polyethylene glycol or polypropylene glycol. One non-limiting example of such a silicate is methoxy polyethylene glycol tetraethyl orthosilicate (mPEG silane). Other silicates could also be used as well, including tetramethyl orthosilicate, tetraethyl orthosilicate (TEOS), tetrapropylorthosilicate, etc. The silicates may also include a hydrophobic portion such as alkyl tetraethyl orthosilicate. In some embodiments, the silica shell may be an interface between an outer layer and an inner layer. In certain embodiments, the silica shell may be an interface between an interior portion of a nanocapsules and an exterior portion of the nanocapsules.

Structures such as these can be prepared, according to certain embodiments, by allowing the carboxylic acid to form a spherical structure, e.g., when contained within a suitable aqueous solution. A silane may then be reacted to the carboxylic acid to form the nanocapsule structure, and optionally, a silicate such as tetraethyl orthosilicate can then be grown on the nanocapsule structure to form the silica shell.

Thus, as mentioned, in certain embodiments, the nanocapsules may be formed within water or another aqueous solution, which can also optionally be at least partially removed. For instance, sufficient water or aqueous solution may be removed to cause the nanocapsules to dry, e.g., to form a powder. In certain embodiments, at least about 10 wt %, at least about 20 wt %, at least about 30 wt %, at least about 40 wt %, at least about 50 wt %, at least about 60 wt %, at least about 70 wt %, at least about 80 wt %, at least about 90 wt %, at least about 95 wt %, at least about 97 wt %, or at least about 99 wt % or more of the water may be removed. In some cases, the powder may have less than about 25 wt %, at least about 20 wt %, at least about 15 wt %, at least about 10 wt %, at least about 8 wt %, at least about 6 wt %, at least about 5 wt %, at least about 4 wt %, at least about 3 wt %, at least about 2 wt %, or at least about 1 wt % water.

A variety of techniques may be used to remove the water, including filtration, centrifugation, freezing, lyophilization, or the like. In some cases, more than one such technique may be used. By removing the water, the nanocapsules may be easier to store or transport. For example, the nanocapsules may be used or sold as a powder, a stock solution, etc., e.g., for later reconstitution and used for 3D-printing, or other techniques such as those discussed herein.

The nanocapsules, after the removal of water, can be reconstituted, or combined with a suitable liquid or other material, e.g. to produce concentrations of nanocapsules within the liquid such as those described herein. The liquid may be water or another suitable material. This may be used, for example to produce a liquid or other material that can be used for 3D-printing, or other suitable applications, such as those discussed herein. For example, powder or stock solution may be combined with a suitable liquid. Non-limiting examples of liquids include, but are not limited to polar or nonpolar solvents, such as water, toluene, dichloromethane, chloroform, or the like. In some cases, the liquid may be prepared to be substantially optically transparent.

Regardless of whether the final liquid containing the nanocapsules is original or reconstituted, the liquid containing the nanocapsules may also contain, in some embodiments, polymerizable entities (e.g., monomers), cross-linking agents, photopolymerization initiators, and the like, such as those discussed herein, in any suitable amount or concentration. These may be present at the formation of the nanocapsules, and/or added afterwards. For instance, these may be added after the nanocapsules are reconstituted in a suitable liquid, e.g., before and/or after adding the nanocapsules to the liquid.

As mentioned, it should be understood that the photon upconversion materials discussed herein are not limited to only 3D-printing applications. Other applications, such as photoredox catalysis chemistry or anti-counterfeiting, are also contemplated as well.

For instance, for photoredox catalysis chemistry, the nanocapsules may be used to control delivery of high energy light to a sample. For example, laser light may be applied to a sample that is of a relatively low intensity, long wavelength, etc., but due to the presence of the nanocapsules, that light may be upconverted to a shorter wavelength that can induce a photoredox reaction to occur. In this way, the amount of light applied to the sample may be controlled. This approach may be particularly useful in the event that shorter wavelength light is prone to scatter, either by the reaction medium, by biological tissue, or whatever medium the photoredox chemistry occurs in. In this case, upconversion may be useful in delivering upconverted short wavelength light further into a reaction than is possible by direct illumination at the same wavelength.

Similarly, for anti-counterfeiting, the nanocapsules may be contained within a suitable component (e.g., paper, a polymer, a metal, or the like), and the presence of upconversion may be used to determine whether the component is genuine or counterfeit. Thus, for instance, laser light may be applied to the component, and if the material produces emission of light at shorter wavelengths than the excitation wavelengths (for example, due to the presence of the nanocapsules), the component can be identified as being genuine.

The following are each incorporated herein by reference in its entirety: U.S. Provisional Patent Application Ser. No. 62/771,996, filed Nov. 27, 2018, by Congreve, et al., and U.S. Provisional Patent Application Ser. No. 62/800,680, filed Feb. 4, 2019, by Congreve, et al.

The following examples are intended to illustrate certain embodiments of the present invention, but do not exemplify the full scope of the invention.

Example 1

Triplet annihilation upconversion is attractive because it features high efficiencies (in some cases upwards of 30%) of anti-Stokes light conversion. However, the high concentrations of chromophores needed to produce collisions between triplet excitons in this process may cause issues with penetration depth where all light is absorbed within a short distance. To make this process practical for applications such as upconversion 3D printing, this example illustrates nanoparticles which contain a locally high concentration of sensitizer and annihilator to allow upconversion, but a globally low concentration (since the nanocapsule concentration can be arbitrarily tuned).

This example includes a nanocapsule system comprising a liquid core (oleic acid) which can dissolve upconversion materials that are soluble in oleic acid, a silica shell which prevents disintegration of the nanocapsules, and a polyethylene glycol outer layer which allows dispersion of the nanocapsules in a number of different solvents. Nanocapsules containing rigid shells that can survive solvents besides water, while being optically clear in water have not been reported before. Thus, this example illustrates robust nanocapsules that can disperse to form clear solutions in a variety of polar or non-polar solvents. These properties allow these nanocapsules to be used to produce optically transparent dispersions within custom or commercially available 3D printing resins where long wavelength light can be used, and only used to drive photopolymerization with upconverted light where the input light reaches sufficient intensity, e.g., allowing for local printing in a vat or other relatively large container of photopolymer.

Figure 3A:
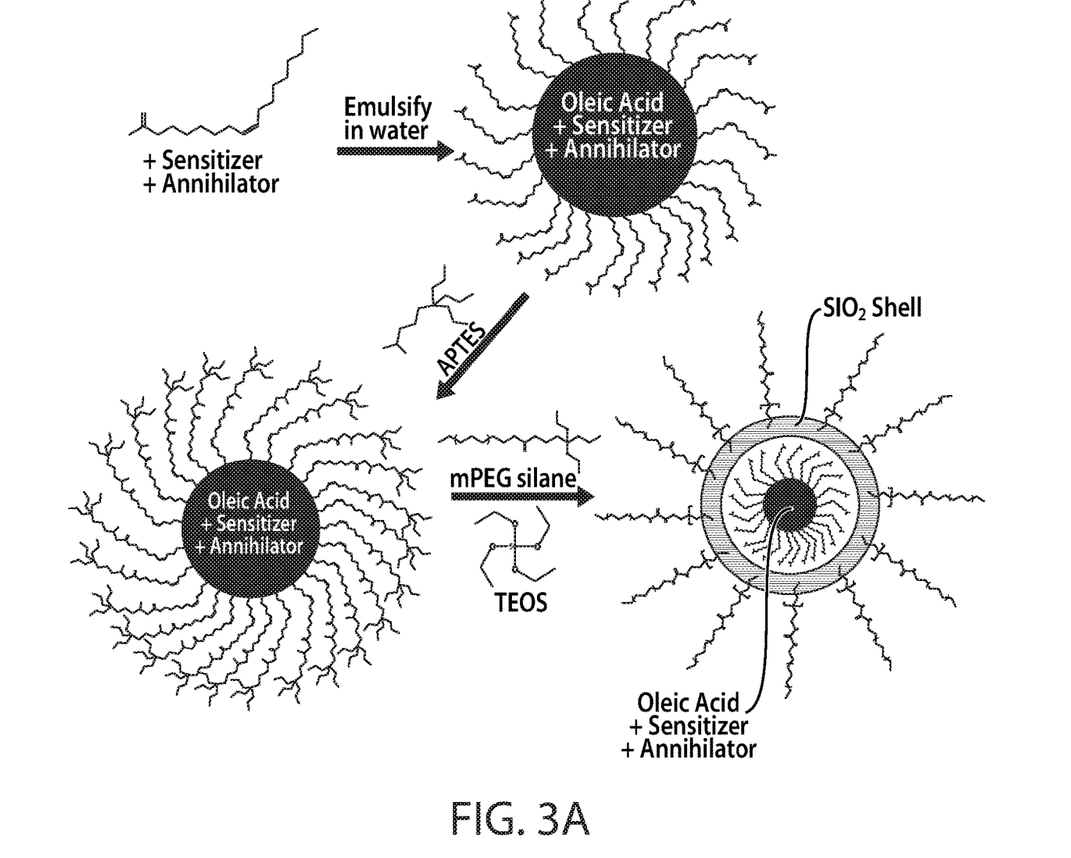
FIGS. 3A-3C illustrate the production of nanocapsules in accordance with still another embodiment of the invention.

A schematic diagram of a method for making the nanocapsules is illustrated in FIG. 3A, and is described as follows. To a 20 mL scintillation vial under inert conditions, 8 mL of deionized water and a stir bar were added. Next, 75 microliters of oleic acid were added, in which was dissolved an upconversion sensitizer and annihilator (0.25 mg/mL of palladium tetraphenyl tetrabenzoporphyrin and 30 mg/mL tetra-t-butyl perylene in one experiment). Another example that was used successfully was saturated palladium tetraphenylporphyrin and saturated 9,10-diphenylanthracene, again dissolved in oleic acid. A third example successfully used saturated palladium tetraphenyl tetrabenzoporphyrin and saturated TIPS-anthracene.

Figure 3B:
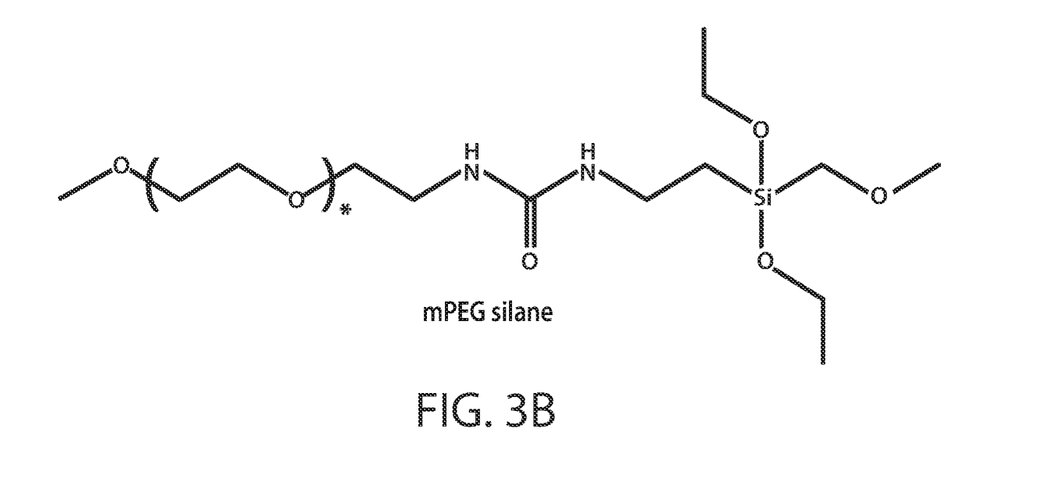

This mixture was then capped and vortexed to produce a cloudy solution. This solution is then stirred at 500 RPM, and 59 microliters of APTES (3-aminopropyl triethoxysilane) was added, causing the solution to become clear. After the solution became clear (~30 seconds), 1500 microliters of tetraethyl orthosilicate (TEOS) and 200 mg of 10,000 g/mol methoxy polyethylene glycol tetraethyl orthosilicate were added at the same time (see FIG. 3B). The mixture was then stirred for 48 hours at 65° C. At the end of 48 hours, the product was a cloudy but well-suspended dispersion in water. The dispersion of nanoparticles in water was then centrifuged for one hour at 7,000 rpm to remove larger particulates from solution. These particulates were discarded, and the resulting solution was centrifuged 12 hours at 7,000 rpm to isolate the nanoparticles from the water. This nanoparticle paste could be dissolved at a later time to form solutions in toluene, dichloromethane, chloroform, or multiple 3D-printing resins.

Example 2

This example characterizes particles produced in Example 1 by optical spectroscopy and transmission electron microscopy.

Figure 3C:
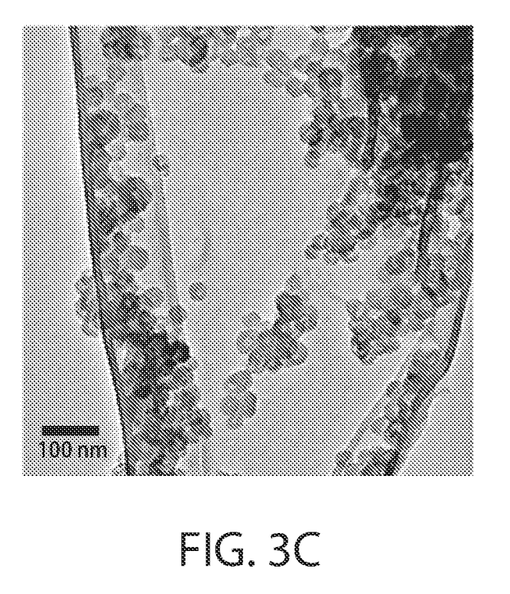

FIG. 3C shows a TEM image of nanoparticles produced as discussed in Example 1. (The non-spherical parts are artifacts from the TEM grid.) With optical spectroscopy, absorption peaks associated with the sensitizer (longest wavelength absorption) as well as from the annihilator can be observed. If peaks associated with the annihilator are optically excited, annihilator fluorescence at longer wavelengths than the annihilator absorption can be observed (i.e., Stokes-shifted fluorescence). However, for these upconversion materials, if the sensitizer absorption is instead excited, depending on the fluence, different behavior may be observed. At extremely low fluence, only sensitizer emission can be seen. As the power is increased, a quadratic increase in upconverted (anti-stokes fluorescence of shorter wavelength than the excitation light) annihilator fluorescence will be observed, which will eventually saturate and increase linearly with fluence.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When the word "about" is used herein in reference to a number, it should be understood that still another embodiment of the invention includes that number not modified by the presence of the word "about."

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A composition for 3D printing, comprising:
   a aqueous liquid comprising a polymerizable entity configured to photopolymerize, water, and a photopolymerization initiator; and
   nanocapsules comprising a surfactant, the nanocapsules having an interior portion and an outer portion, the interior portion comprising an upconversion material, and the outer portion comprising a silica shell with polyethylene glycol covalently bonded to the silica shell,
   wherein the upconversion material comprises a sensitizer and an annihilator, and is configured to emit upconverted light when electromagnetic radiation is applied, the upconverted light capable of initiating polymerization of the polymerizable entity.

2. The composition of claim 1, wherein at least some of the nanocapsules are micelles.

3. The composition of claim 1, wherein the nanocapsules have an average diameter of less than 1 micrometer.

4. The composition of claim 1, wherein the nanocapsules have an average diameter of less than about 50 nm.

5. The composition of claim 1, wherein the nanocapsules have an average diameter of between 30 nm and 40 nm.

6. The composition of claim 1, wherein the upconversion material is dissolved in the interior portion.

7. The composition of claim 1, wherein the interior portion comprises a nonpolar solvent.

8. The composition of claim 1, wherein the interior portion comprises a carboxylic acid.

9. The composition of claim 1, wherein the interior portion comprises oleic acid.

10. The composition of claim 1, wherein the sensitizer and the annihilator exhibit triplet annihilation upconversion.

11. The composition of claim 1, wherein the sensitizer comprises palladium tetraphenyl tetrabenzoporphyrin.

12. The composition of claim 1, wherein the annihilator comprises 9,10-diphenylanthracene.

13. The composition of claim 1, wherein the nanocapsules are substantially miscible with the aqueous liquid.

14. The composition of claim 1, wherein the aqueous liquid is optically transparent.

15. The composition of claim 1, wherein the aqueous liquid has a viscosity of 1 cP or more.

16. The composition of claim 1, wherein the aqueous liquid has a viscosity of 10,000 cP or more.

17. The composition of claim 1, wherein the polymerizable entity comprises a resin.

18. The composition of claim 1, wherein the polymerizable entity comprises monomers.

19. The composition of claim 1, wherein the polymerizable entity comprises an acrylate.

20. The composition of claim 1, wherein the polymerizable entity comprises a methacrylate.

21. The composition of claim 1, wherein the annihilator comprises bis[(triisopropylsilyl)ethynyl]anthracene.

* * * * *

UNITED STATES PATENT AND TRADEMARK OFFICE
CERTIFICATE OF CORRECTION

PATENT NO. : 12,291,662 B2
APPLICATION NO. : 17/296769
DATED : May 6, 2025
INVENTOR(S) : Daniel N. Congreve et al.

Page 1 of 1

It is certified that error appears in the above-identified patent and that said Letters Patent is hereby corrected as shown below:

On the Title Page

Item (60), Related U.S. Application Data, please change:
"Provisional application No. 62/800,680, filed on May 25, 2021, provisional application No. 62/771,996, filed on May 25, 2021."

To:
-- Provisional application No. 62/800,680, filed on February 4, 2019, provisional application No. 62/771,996, filed on November 27, 2018. --.

Signed and Sealed this
Eighth Day of July, 2025

Coke Morgan Stewart
*Acting Director of the United States Patent and Trademark Office*